(12) United States Patent
Kristal et al.

(10) Patent No.: US 11,271,047 B2
(45) Date of Patent: Mar. 8, 2022

(54) OLED DISPLAY SUBSTRATE AND OLED DISPLAY DEVICE

(71) Applicant: BOE Technology Group Co., Ltd., Beijing (CN)

(72) Inventors: Boris Kristal, Beijing (CN); Chieh Hsing Chung, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 793 days.

(21) Appl. No.: 16/071,554

(22) PCT Filed: Dec. 15, 2017

(86) PCT No.: PCT/CN2017/116625
§ 371 (c)(1),
(2) Date: Jul. 20, 2018

(87) PCT Pub. No.: WO2018/205619
PCT Pub. Date: Nov. 15, 2018

(65) Prior Publication Data
US 2021/0202599 A1 Jul. 1, 2021

(30) Foreign Application Priority Data
May 12, 2017 (CN) .......................... 201710334644.8

(51) Int. Cl.
*H01L 29/18* (2006.01)
*H01L 21/00* (2006.01)
(Continued)

(52) U.S. Cl.
CPC ...... *H01L 27/3218* (2013.01); *H01L 27/3209* (2013.01); *H01L 51/5056* (2013.01); *H01L 51/5072* (2013.01); *H01L 51/5092* (2013.01)

(58) Field of Classification Search
CPC .................. H01L 51/5019; H01L 27/3209
(Continued)

(56) References Cited

U.S. PATENT DOCUMENTS 9,666,825 B2 * 5/2017 Seo ..................... H01L 51/0052
9,859,341 B2 * 1/2018 Huang .................. H01L 51/001
(Continued)

FOREIGN PATENT DOCUMENTS

CN           1878439 A      12/2006
CN         104425737 A       3/2013
(Continued)

OTHER PUBLICATIONS

First office action of Chinese application No. 201710334644.8 dated May 7, 2019.
(Continued)

*Primary Examiner* — Calvin Lee
(74) *Attorney, Agent, or Firm* — Fay Sharpe LLP

(57) ABSTRACT

Provided are an OLED display substrate (100) and an OLED display device, in the field of display device. The OLED display substrate (100) includes a plurality of pixels, and each of the pixels includes two sub-pixels. The two sub-pixels include a first sub-pixel (210) and a second sub-pixel (220). The first sub-pixel (210) includes a first light-emitting unit (211) and a second light-emitting unit (212) that are stacked; the second sub-pixel (220) includes a third light-emitting unit (213); and the first light-emitting unit (211), the second light-emitting unit (212) and the third light-emitting unit (213) are configured to emit lights with different colors. Under the same resolution, the aperture ratio of the OLED display substrate (100) may be increased. Alternatively, under the same size of sub-pixels, the resolution of the
(Continued)

OLED display substrate (100) may be increased. Therefore, the brightness uniformity and display effect of the OLED display panel are improved.

19 Claims, 10 Drawing Sheets

(51) Int. Cl.
*H01L 27/32* (2006.01)
*H01L 51/50* (2006.01)

(58) Field of Classification Search
USPC .......................... 438/28, 34–35; 257/84, 88
See application file for complete search history.

(56) References Cited

U.S. PATENT DOCUMENTS

| | | | |
|---|---|---|---|
| 9,917,271 B2 * | 3/2018 | Uesaka | H01L 27/322 |
| 10,255,837 B2 * | 4/2019 | Yata | G09G 3/2003 |
| 10,665,808 B2 * | 5/2020 | Seo | H01L 51/5016 |
| 2006/0231842 A1 | 10/2006 | Hirakata et al. | |
| 2007/0103066 A1 | 5/2007 | D Andrade et al. | |
| 2012/0319147 A1 | 12/2012 | Ko et al. | |
| 2015/0060793 A1 | 3/2015 | Song et al. | |
| 2015/0311262 A1 | 10/2015 | Wang et al. | |
| 2016/0155378 A1 | 6/2016 | Hack et al. | |
| 2017/0047550 A1 | 2/2017 | Lee | |
| 2018/0190728 A1 | 7/2018 | Wu et al. | |
| 2018/0331161 A1 * | 11/2018 | Liao | H01L 51/5206 |
| 2020/0133064 A1 * | 4/2020 | Yamazaki | H04N 1/6066 |

FOREIGN PATENT DOCUMENTS

| | | |
|---|---|---|
| CN | 103681762 A | 3/2014 |
| CN | 104617127 A | 5/2015 |
| CN | 105895663 A | 8/2016 |
| CN | 106449693 A | 2/2017 |
| CN | 107146806 A | 9/2017 |
| JP | 2005174639 A | 6/2005 |

OTHER PUBLICATIONS

International Search Report (including English translation) and Written Opinion mailed in PCT/CN2017/116625, dated Mar. 14, 2018, 12 pages.

\* cited by examiner

OLED DISPLAY SUBSTRATE AND OLED DISPLAY DEVICE

CROSS REFERENCE TO RELATED APPLICATIONS

This application is a 371 of PCT Patent Application Serial No. PCT/CN2017/116625 filed Dec. 15, 2017, which claims priority to Chinese Patent Application No. 201710334644.8, filed with the State Intellectual Property Office on May 12, 2017 and titled "OLED DISPLAY SUBSTRATE AND OLED DISPLAY DEVICE," the entire contents of which are incorporated herein by reference.

TECHNICAL FIELD

The present disclosure relates to an OLED display substrate and an OLED display device.

BACKGROUND

Currently, common display devices include passive light-emitting display devices (such as liquid crystal display devices) and active light-emitting display devices (such as organic light-emitting diode (OLED) display devices). Since there is no need to be provided with a backlight, the active light-emitting display device, compared with the passive light-emitting display device, has the advantages of less thickness, lower power consumption, higher response speed and etc., which is very competitive in the market.

An OLED display device usually includes a plurality of pixels arranged in an array. Each of the pixels includes three sub-pixels arranged side by side. The three sub-pixels are respectively used to emit light of different colors. The pixel may display different colors by controlling light emission brightness of the three sub-pixels in the same pixel. In general, one of the three sub-pixels is used to emit red light, the other one is used to emit blue light and the last one is used to emit green light. Each of the sub-pixels includes an anode, a light-emitting layer and a cathode. Holes provided by the anode and electrons provided by the cathode form excitons on the light-emitting layer. Light with a predetermined wavelength is emitted when the excitons fall into a ground state. Depending on the different material properties of the light-emitting layers, red light, green light and blue light can be formed.

Since each of the sub-pixels needs to be driven independently, an isolation structure such as a pixel definition layer, and a driving structure such as a TFT array are also arranged in the OLED display device.

SUMMARY

There are provided, in at least one embodiment of the present disclosure, an OLED display substrate and an OLED display device.

There is provided, in at least one embodiment of the present disclosure, an OLED display substrate, including: a plurality of pixels arranged in an array, where each of the pixels includes two sub-pixels; the two sub-pixels include a first sub-pixel and a second sub-pixel; the first sub-pixel includes a first light-emitting unit and a second light-emitting unit that are stacked; the second sub-pixel includes a third light-emitting unit; and the first light-emitting unit, the second light-emitting unit and the third light-emitting unit are configured to emit lights of different colors.

In an implementation, one of the first light-emitting unit and the second light-emitting unit is configured to emit red light; the other one of the first light-emitting unit and the second light-emitting unit is configured to emit blue light; and the third light-emitting unit is configured to emit green light.

Optionally, a light-emitting area of the first sub-pixel is greater than a light-emitting area of the second sub-pixel.

In another implementation, the second sub-pixel further includes a fourth light-emitting unit; the fourth light-emitting unit and the third light-emitting unit are stacked; a color of light emitted by the fourth light-emitting unit is the same as a color of light emitted by any one of the first light-emitting units, the second light-emitting unit and the third light-emitting unit.

Optionally, one of the first light-emitting unit and the second light-emitting unit is configured to emit red light, the other one of the first light-emitting unit and the second light-emitting unit is configured to emit blue light, one of the third light-emitting unit and the fourth light-emitting unit is configured to emit green light, and the other one of the third light-emitting unit and the fourth light-emitting unit is configured to emit blue light.

Optionally, the first light-emitting unit is configured to emit red light; the second light-emitting unit and the fourth light-emitting unit are configured to emit blue light; the third light-emitting unit is configured to emit green light; and the second light-emitting unit and the fourth light-emitting unit are located at a same side of the first light-emitting unit and the third light-emitting unit.

Optionally, one of the first light-emitting unit and the second light-emitting unit is configured to emit red light; the other one of the first light-emitting unit and the second light-emitting unit is configured to emit green light; and both the third light-emitting unit and the fourth light-emitting unit are configured to emit blue light.

In still another implementation, the second sub-pixel further includes a fourth light-emitting unit; the fourth light-emitting unit and the third light-emitting unit are stacked; a color of light emitted by the fourth light-emitting unit is different from colors of lights emitted by the first light-emitting unit, the second light-emitting unit and the third light-emitting unit.

Optionally, one of the first light-emitting unit and the second light-emitting unit is configured to emit red light; the other one of the first light-emitting unit and the second light-emitting unit is configured to emit green light; and the third light-emitting unit is configured to emit blue light.

In an implementation, the first light-emitting unit includes a first anode, a first light-emitting layer and a first cathode that are successively stacked on the second light-emitting unit; and the second light-emitting unit includes a second anode, a second light-emitting layer and a second cathode that are successively stacked.

Further, in the first sub-pixel, the first anode and the second cathode are stacked and connected with a same thin film transistor; and the second anode and the first cathode are connected with a same signal line.

Furthermore, the signal line is configured to input an alternating current signal; and the frequency of the alternating current signal is not less than 30 Hz.

Optionally, the first light-emitting unit and the second light-emitting unit each further includes a hole injection layer, a hole transporting layer, an electron transporting layer and an electron injection layer; and the second anode, the hole injection layer of the second light-emitting unit, the hole transporting layer of the second light-emitting unit, the second light-emitting layer, the electron transporting layer of the second light-emitting unit, the electron injection layer of the second light-emitting unit, the second cathode, the first anode, the hole injection layer of the first light-emitting unit, the hole transporting layer of the first light-emitting unit, the first light-emitting layer, the electron transporting layer of the first light-emitting unit, the electron injection layer of the first light-emitting unit, and the second cathode are successively stacked.

Optionally, the first anode is made of Ag; and the second cathode is made of Au.

Optionally, a thickness of the first anode is 2-5 nm, and a thickness of the second cathode is 5-10 nm.

Optionally, the second anode is made of a transparent conductive material; and the first cathode is made of metal.

Further, a thickness of the first cathode is 100-200 nm.

Optionally, further including a plurality of thin film transistors, where each of the sub-pixels is correspondingly connected to one of the thin film transistors, each of the TFTs includes a buffer layer arranged on a base substrate, an active layer arranged on the buffer layer, a gate insulating layer arranged on the active layer, a gate electrode arranged on a predetermined region of the gate insulating layer, an intermediate insulating layer arranged on the gate electrode, and a source electrode and a drain electrode that are arranged on the intermediate insulating layer; the source electrode and the drain electrode are respectively connected with a source electrode region and a drain electrode region of the active layer through a via; an intermediate electrode of the first sub-pixel is connected with the source electrode of the thin film transistor corresponding to the first sub-pixel through a via; and the intermediate electrode is formed by stacking the first anode and the second cathode.

There is provided, in at least one embodiment of the present disclosure, an OLED display device including any one of the OLED display panels described above.

BRIEF DESCRIPTION OF THE DRAWINGS

FIG. 2b is a schematic diagram of a layer structure of the pixel in FIG. 2a;

FIG. 7b is a schematic diagram of a layer structure of the pixel in FIG. 7a.

DETAILED DESCRIPTION

The present disclosure will be described in further detail with reference to the enclosed drawings, so as to clearly present the principles and advantages of the present disclosure.

Figure 1:
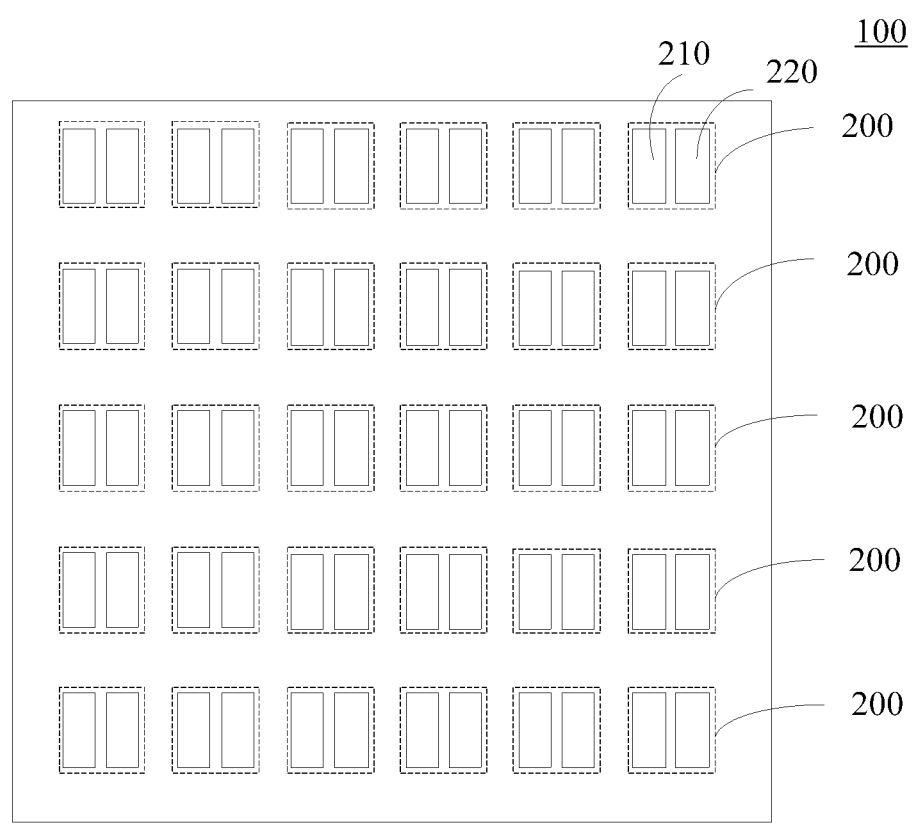
FIG. 1 is a schematic diagram of a structure of an OLED display substrate provided in an embodiment of the present disclosure.

FIG. 1 is a schematic diagram of a structure of an OLED display substrate provided in an embodiment of the present disclosure. As shown in FIG. 1, the OLED display substrate 100 includes a plurality of pixels 200 arranged in an array. Each of the pixels 200 includes two sub-pixels, i.e., a first sub-pixel 210 and a second sub-pixel 220.

Figure 2A:
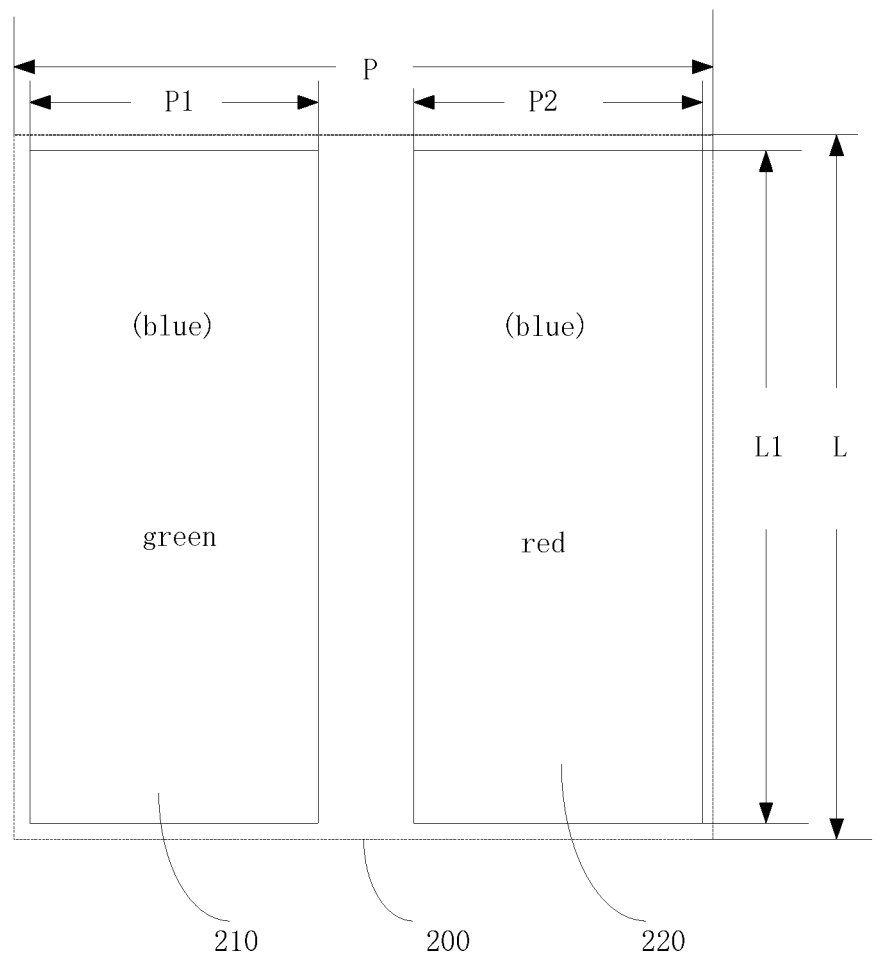
FIG. 2a is a schematic diagram of an enlarged structure of a pixel of the OLED display substrate in FIG. 1.
Figure 2B:
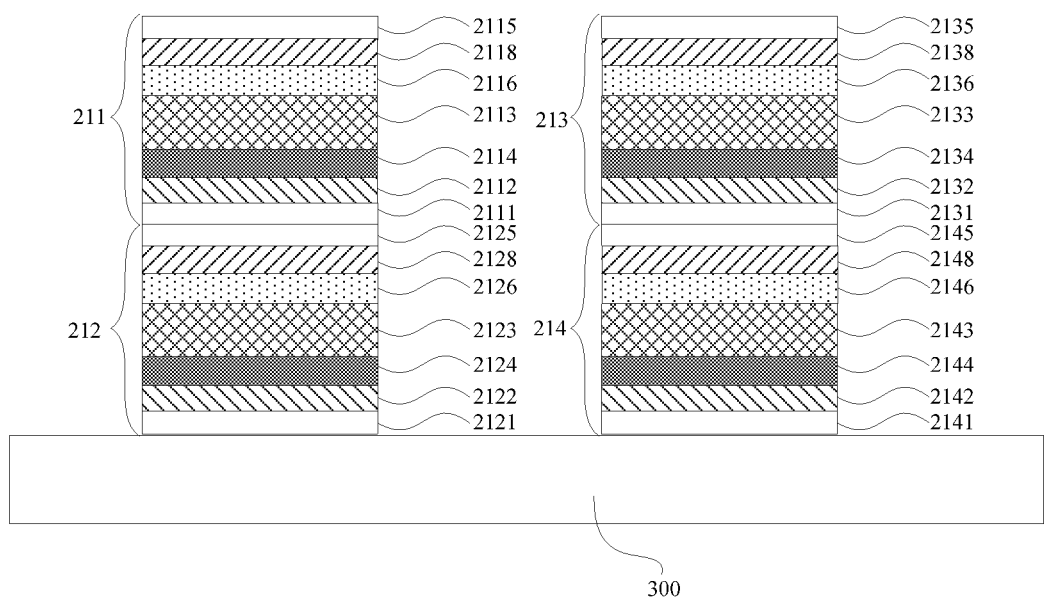

FIG. 2a is a schematic diagram of an enlarged structure of a pixel of the OLED display substrate in FIG. 1. FIG. 2b is a schematic diagram of a layer structure of FIG. 2a. As shown in FIGS. 2a and 2b, the first sub-pixel 210 includes a first light-emitting unit 211 and a second light-emitting unit 212 that are stacked. The second sub-pixel 220 includes a third light-emitting unit 213 and a fourth light-emitting unit 214 that are stacked. That is, exemplarily, four light-emitting units are arranged in each of the pixels 200 and are stacked two by two. Herein, the first light-emitting unit 211, the second light-emitting unit 212 and the third light-emitting unit 213 are configured to emit lights with different colors. The color of light emitted by the fourth light-emitting unit 214 may be the same as the color of light emitted by any one of the first light-emitting units 211, the second light-emitting unit 212 and the third light-emitting unit 213.

As shown in FIG. 2a, a pixel region (as indicated by a dashed box in FIGS. 1 and 2a) in an embodiment of the present disclosure has a rectangular shape with a length of L and a width of P. A light-emitting region of the first sub-pixel 210 also has a rectangular shape with a length of L1 and a width of P1. A light-emitting region of the second sub-pixel 220 also has a rectangular shape with a length of L1 and a width of P2. Thus, an aperture ratio of the pixel 200 is $(P1+P2)*L1/(P*L)$.

Figure 2C:
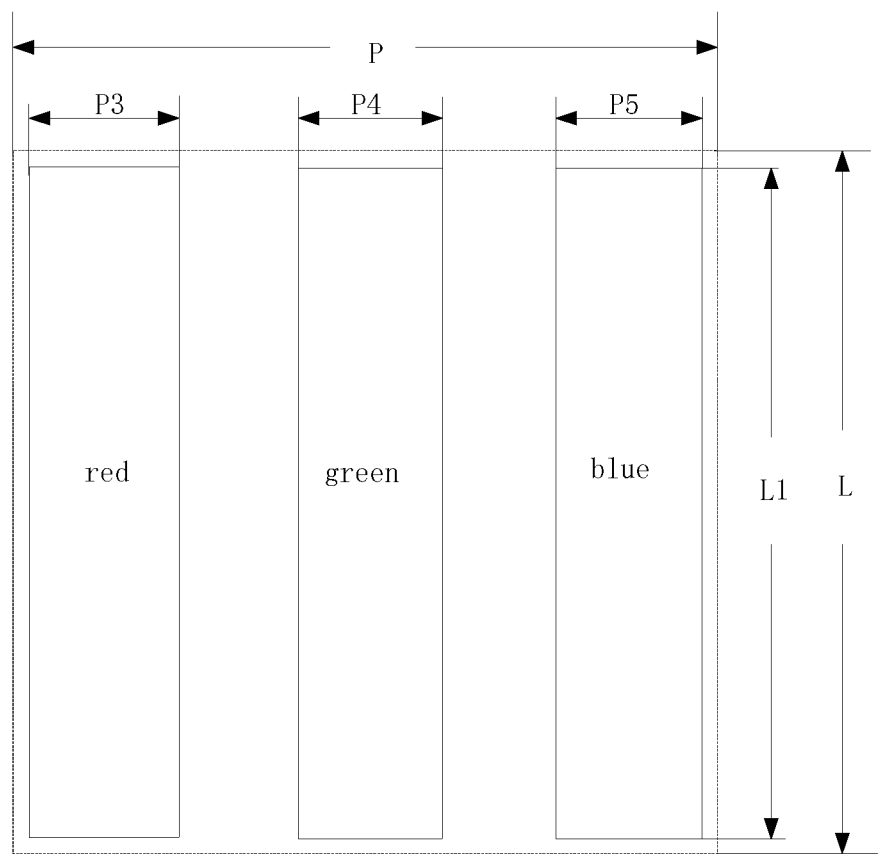
FIG. 2c is a schematic diagram of a pixel of a conventional OLED display substrate.

FIG. 2c is a schematic diagram of a structure of a pixel of a traditional OLED display substrate. As shown in FIG. 2c, one pixel of the traditional OLED display substrate includes three sub-pixels, and the pixel region thereof is the same as the pixel region shown in FIG. 2a in shape and size, namely, the pixel region has a rectangular shape with a length of L and a width of P. Herein, a light-emitting region of each of the three sub-pixels has a rectangular shape with a length of L1. From left to right, widths of the light-emitting regions of the three sub-pixels are respectively P3, P4 and P5, the aperture ratio of the pixel is $(P3+P4+P5)*L1/(P*L)$. In the case of a distance between adjacent sub-pixels being a fixed value (namely, a distance between adjacent sub-pixels in FIG. 2b is equal to a distance between adjacent sub-pixels in FIG. 2c), $P1+P2>P3+P4+P5$. Therefore, the aperture ratio of the pixel shown in FIG. 2a is greater than the aperture ratio of the pixel shown in FIG. 2c.

It can be seen that, on the one hand, under the same resolution (i.e., the pixels are equal in size), when each of the pixels on the OLED display substrate includes two sub-pixels, if the number of the sub-pixels in each of the pixels is reduced, driving structures corresponding to the sub-pixels can be reduced, an occupied area of the driving structures can also be reduced correspondingly, and thus the light-emitting area of each of the sub-pixels can be increased, thereby increasing the aperture ratio of the pixel of the OLED display substrate. On the other hand, in the case where each of the sub-pixels of the OLED display substrate is the same as the sub-pixel of the traditional OLED display substrate in size, each of the pixels on the OLED display substrate is set to include two sub-pixels, so that an area of each pixel is reduced, so that the resolution of the OLED display substrate may be improved.

In the embodiments shown in FIGS. 2a and 2b, the first light-emitting unit 211 is configured to emit green light. The second light-emitting unit 212 is configured to emit blue light. The third light-emitting unit 213 is configured to emit red light. The fourth light-emitting unit 214 is configured to emit blue light. All these light-emitting units (including the first light-emitting unit 211, the second light-emitting unit 212, the third light-emitting unit 213 and the fourth light-emitting unit 214) are arranged on a substrate 300.

It should be noted that in other embodiments, the fourth light-emitting unit 214 may also be configured to emit red light or green light. In some further embodiments, the fourth light-emitting unit may also be configured to emit light of a color different from those of lights emitted by the first light-emitting unit, the second light-emitting unit and the third light-emitting unit, such as yellow light.

In the embodiments shown in FIGS. 2a and 2b, the second light-emitting unit 212 is located below the first light-emitting unit 211. The fourth light-emitting unit 214 is located below the third light-emitting unit 213. In FIG. 2a, the bracketed color represents the color of emitted light of the light-emitting unit located below (in a direction away from the substrate 300). The non-bracketed color represents the color of emitted light of the light-emitting unit located above (in a direction closer to the substrate 300).

It should be noted that in other embodiments, the positions of one or two pairs of light-emitting units may also be exchanged. For example, the first light-emitting unit 211 is disposed below the second light-emitting unit 212, or the third light-emitting unit 213 is disposed below the fourth light-emitting unit 214, or the first light-emitting unit 211 is disposed below the second light-emitting unit 212 and the third light-emitting unit 213 is disposed below the fourth light-emitting unit 214 at the same time. In order to simplify a manufacturing process, optionally, the light-emitting units that emit lights with the same color are disposed on the same layer, that is, disposed above at the same time or disposed below at the same time.

In the embodiments of the present disclosure, each of the light-emitting units includes an anode, a light-emitting layer and a cathode that are successively stacked. Exemplarily, as shown in FIG. 2b, the first light-emitting unit 211 includes a first anode 2111, a first light-emitting layer 2113 and a first cathode 2115 that are successively stacked on the second light-emitting unit 212. The second light-emitting unit 212 includes a second anode 2121, a second light-emitting layer 2123 and a second cathode 2125 that are successively stacked on the substrate 300.

Herein, the substrate 300 may be a base substrate (which may be made of glass, polymer, metal foil and the like), and may also be a TFT (thin film transistor) array substrate (i.e., a base substrate with a plurality of TFTs arranged in an array). The TFT array substrate includes a plurality of TFTs arranged in an array. Each of the sub-pixels includes one TFT configured to control the light-emitting units in the sub-pixel to emit light.

The second anode 2121 may be made of an indium tin oxide (ITO) thin film, an indium zinc oxide (IZO) thin film or other transparent conductive materials, and is usually made of a conductive material with a work function greater than 4.0 eV. The first anode 2111 may be made of a material with a work function greater than 4.0 eV such as Au. The second cathode 2125 may be made of metal or alloy such as Ag, Mg:Ag and Al, and is usually made of a conductive material with a work function less than 4.0 eV. The first cathode 2115 may be made of a conductive material with a work function less than 4.0 eV such as Al. During implementation, a conductive material layer may be formed by sputtering, evaporation and the like, and then the above-mentioned anode or cathode can be formed through a patterning process.

The second light-emitting layer 2123 may be an organic material light-emitting layer (a fluorescent organic material for emitting blue light) or a quantum dot-based light-emitting layer. The first light-emitting layer 2113 may be an organic material light-emitting layer (a phosphorescent organic material for emitting green light) or a quantum dot-based light-emitting layer. During implementation, the light-emitting layer may be formed by printing, or may be formed through depositing and patterning processes.

Further, when the first anode 2111 is made of Ag while the second cathode 2125 is made of Au, the thinner Au layer serves as a wetting layer, which can ensure that an Ag layer formed on the wetting layer may continuously form films in a relatively small thickness. In such a case, a thickness of the first anode 2111 may be 2-5 nm, and a thickness of the second cathode 2125 may be 5-10 nm. As such, the first anode 2111 and the second cathode 2125 are set to be relatively thin, so that the first anode and the second cathode can be in a semi-transparent state, thereby reducing the effects of the first anode and the second cathode on the light emission performance of the light-emitting units. In addition, this thickness range can ensure that the first anode 2111 and the second cathode 2125 may form films continuously. If the first anode 2111 and the second cathode 2125 are made of other materials, the thickness of both may be 10-20 nm, and the light transmission effect will be reduced.

The thickness of the first cathode 2115 may be 100-200 nm, and this thickness may play a light reflecting effect since the first cathode 2115 is usually made of metal, so as to further improve the light extraction efficiency. Optionally, the thickness of the second anode 2121 may be 5-5000 nm, the thickness of the first light-emitting layer 2113 may be 5-200 nm, and the thickness of the second light-emitting layer 2123 may be 5-200 nm.

It should be noted that in some embodiments, the first cathode 2115 plays a light reflecting effect while the second anode 2121 is made of the transparent conductive material. Therefore, the light exits from a side where the base substrate 300 is located. In other embodiments, the first cathode 2115 may also be made of the transparent conductive material while the second anode 2121 plays a light reflecting effect. At this time, the light exits toward a side away from the base substrate 300.

The second anode 2121 and the first cathode 2115 are connected in a display device, which may be connected with an external wiring (i.e., a signal line), and may be in the same potential when a voltage is applied. The first anode 2111 and the second cathode 2125 are directly stacked to form an independent counter electrode. A voltage between the second anode 2121 and the counter electrode and a voltage between the first cathode 2115 and the counter electrode control the first light-emitting unit 211 or the second light-emitting unit 212 in the first sub-pixel 210 to emit light. Exemplarily, when the second anode 2121 and the first cathode 2115 are connected to a positive voltage with respect to the counter electrode, it can be seen that the second light-emitting unit 212 emits blue light when being forward biased and does not emit light when being reverse-biased. When the second anode 2121 and the first cathode 2115 are connected to a negative voltage with respect to the counter electrode, the first light-emitting unit 211 emits green light when being forward-biased while the second light-emitting unit 212 does not emit light.

During implementation, the first light-emitting unit 211 may further include other layer structures. For example, as shown in FIG. 2b, the first light-emitting unit 211 further includes a hole injection layer (HIL) 2112, a hole transporting layer (HTL) 2114, an electron transporting layer (ETL) 2116 and an electron injection layer (EIL) 2118. Likewise, the second light-emitting unit 212 may also include other layer structures. For example, as shown in FIG. 2b, the second light-emitting unit 212 further includes an HIL 2122, an HTL 2124, an ETL 2126 and an EIL 2128.

The HILs 2112 and 2122 may be made of an organic material (such as LG-101 and its analogues, a P-type doped organic hole transporting material) or an inorganic material (such as molybdenum oxide and vanadium oxide). The HTLs 2114 and 2124 may be made of materials such as N,N-bis(3-methylphenyl)-N,N-diphenyl-1,1'-diphenyl-4,4'-diamine (TPD), 4,4-N,N-dicarbazolebiphenyl (CBP), N,N-bis(1-naphthyl)-N,N-diphenyl-1,1'-diphenyl-4,4'-diamine (NPD), polyaniline, and N,N'-bis(1-naphthyl-N,N-diphenyl-(1,1'-biphenyl)-4,4'-diamine (NPB). The ETLs 2116 and 2126 may be made of materials such as an organic material, an n-type doped material and inorganic nanoparticles. The EILs 2118 and 2128 may be made of materials such as lithium fluoride and lithium quinolate. During implementation, the HILs, the HTLs, the ETLs and the EILs may be formed by printing or may be formed through depositing and patterning processes.

Optionally, the thickness of the HILs 2112 and 2122 may be 5-200 nm; the thickness of the HTLs 2114 and 2124 may be 5-200 nm; the thickness of the ETLs 2116 and 2126 may be 5-200 nm; and the thickness of the EILs 2118 and 2128 may be 0.2-50 nm.

A layer structure of the third light-emitting unit 213 and the fourth light-emitting unit 214 that are stacked, which is the same as a layer structure of the first light-emitting unit 211 and the second light-emitting unit 212, includes a second anode 2141, an HIL 2142, an HTL 2144, a second light-emitting layer 2143, an ETL 2146, an EIL 2148, a second cathode 2145, a first anode 2131, an HIL 2132, an HTL 2134, a first light-emitting layer 2133, an ETL 2136, an EIL 2138 and a first cathode 2135 that are successively and stacked on the substrate 300. The material and thickness of each layer may refer to the related description of the first light-emitting unit 211 and the second light-emitting unit 212, and the detailed description thereof is omitted herein. It should be noted that the third light-emitting layer 2133 is configured to emit red light and may be a phosphorescent organic material light-emitting layer or a quantum dot-based light-emitting layer.

Figure 3:
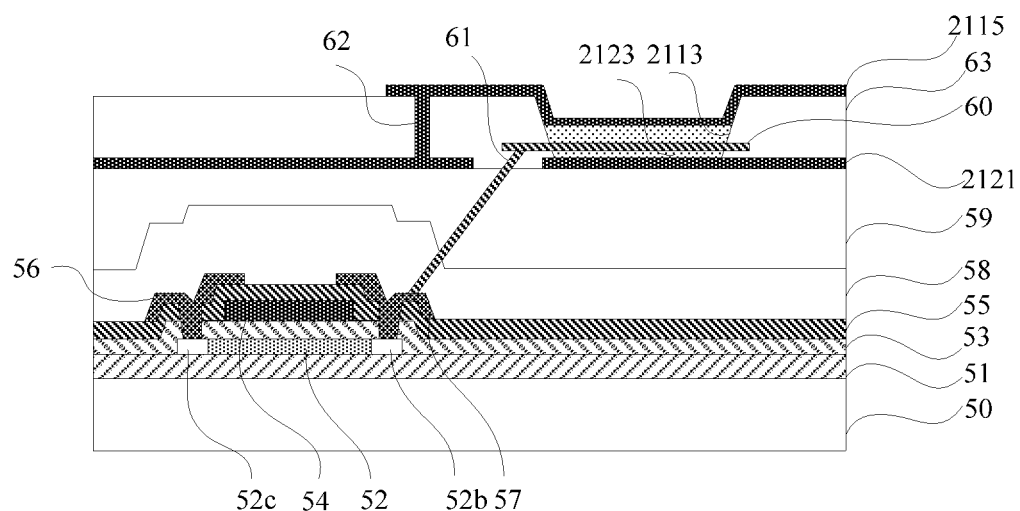
FIG. 3 is a schematic diagram of a structure of a section of a first sub-pixel provided in an embodiment of the present disclosure.

FIG. 3 is a schematic diagram of a structure of a section of a first sub-pixel provided in an embodiment of the present disclosure. As shown in FIG. 3, a thin film transistor for controlling the light-emitting units (including the first light-emitting unit 211 and the second light-emitting unit 212) in the first sub-pixel 210 to emit light is disposed on a base substrate 50. The thin film transistor includes a buffer layer 51 disposed on the base substrate 50, an active layer 52 having a predetermined pattern disposed on the buffer layer 51, a gate insulating layer 53 disposed on the active layer 52, a gate electrode 54 disposed on a predetermined region of the gate insulating layer 53, an intermediate insulating layer 55 disposed on the gate electrode 54, and a source electrode 56 and a drain electrode 57 that are formed on the intermediate insulating layer 55. The source electrode 56 and the drain electrode 57 are respectively connected with a source electrode region 52b and a drain electrode region 52c of the active layer 52 through vias. Herein, the base substrate 50 may be a glass substrate or a plastic substrate.

Moreover, the thin film transistor further includes a passivation layer 58 disposed on the source electrode 56 and the drain electrode 57, and a planarization layer 59 disposed on the passivation layer. The passivation layer 58 may be made of silicon dioxide or silicon nitride. The planarization layer 59 may be made of an organic substance such as an acryl material, polyimide, benzocyclobutene (BCB), or the like.

The light-emitting units of the abovementioned first sub-pixel 210 are disposed on the planarization layer 59. Exemplarily, for convenience of description, FIG. 3 only shows the first anode 2111, the first light-emitting layer 2113, the second light-emitting layer 2123 and the second cathode 2125 in the first sub-pixel 210, and also shows an intermediate electrode 60. The intermediate electrode 60 is formed by stacking the abovementioned first anode 2111 and the second cathode 2125.

As shown in FIG. 3, the intermediate electrode 60 is connected with the source electrode 57 of the TFT through a via 61. The second anode 2121 and the first cathode 2115 are connected through a via 62, so that they can be connected to a driving integrated circuit (IC) through the same signal line (not shown). During implementation, the intermediate electrode 60 may be a block electrode. The intermediate electrodes in each sub-pixel may be independently provided. The second anode 2121 may be a surface electrode. The second anodes 2121 in each sub-pixel may be connected to each another.

The signal line is configured to input an alternating current signal whose frequency is not less than 30 Hz, usually not less than 50 Hz, and for example, may be 100 Hz-120 Hz, so that the human eyes do not perceive the flicker of the light-emitting units. By setting this frequency, although the first light-emitting unit and the second light-emitting unit do not actually emit lights at the same time, what the human eyes see is that the two light-emitting units emit lights at the same time. It should be noted that in the embodiments of the present disclosure, the alternating current signal is a signal that alternately provides a positive voltage and a negative voltage, and the alternating frequency and amplitude of the positive voltage and the negative voltage, a duration of the positive voltage and a duration of the negative voltage may be set according to actual demands. The alternating current signal may be a square signal for facilitating implementation. Furthermore, the positive voltage or the negative voltage in some embodiments may be equal to 0. The alternating current signal is adopted to drive the light-emitting unit to emit light, and the positive voltage and the negative voltage may alternately act on the same light-emitting unit, so that the accumulation of charges in the light-emitting layer of the light-emitting unit can be reduced, thereby prolonging the service life thereof.

It should be noted that a position relationship between the TFT and the light-emitting unit shown in FIG. 3 is only an example. During specific implementation, the TFT may further be disposed directly below the light-emitting unit.

FIGS. 4a-4e show waveform diagrams of different driving signals of a pixel provided in an embodiment of the present disclosure, and the driving signals (i.e., aforementioned alternating current signals) are square signals. The driving signal is divided into a plurality of cycles. Each of the cycles includes a positive half cycle and a negative half cycle. The difference of the plurality of driving signals in FIGS. 4a-4e is that amplitudes of voltages in the positive half cycle and the negative half cycle are different. In FIGS. 4a-4e, the abscissa represents time with the unit being μs; the ordinate represents relative intensity, and thus the specific unit magnitude order thereof is not shown. FIGS. 5a-5e show spectrograms when the first sub-pixel in FIGS. 2a and 2b emit lights under the driving of driving signals shown in FIGS. 4a-4e, in which the abscissa represents the wavelength in nm; the ordinate represents relative intensity, so the specific unit magnitude order is not shown. FIGS. 6a-6e show spectrograms when the second sub-pixel in FIGS. 2a and 2b emit lights under the driving of the driving signals shown in FIGS. 4a-4e, in which the abscissa represents the wavelength in nm; the ordinate represents relative intensity, so the specific unit magnitude order is not shown. The light emission situations of the sub-pixels under each driving signal are explained below according to a corresponding relationship therebetween.

Figure 4A:
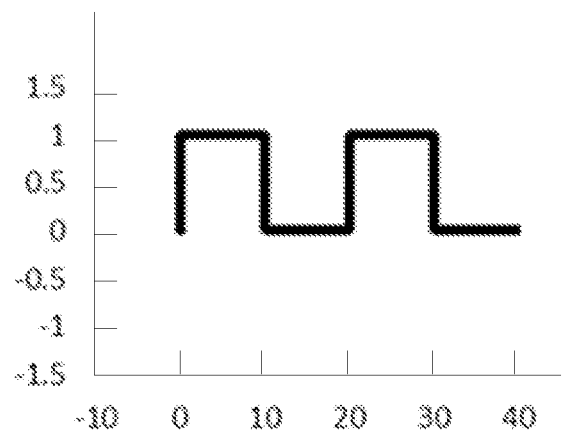
FIGS. 4a-4e show waveform diagrams of different driving signals of a pixel provided in an embodiment of the present disclosure.
Figure 5A:
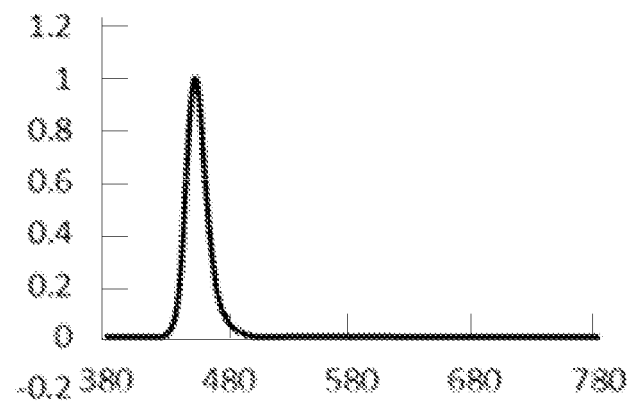
FIGS. 5a-5e show spectrograms when the first sub-pixel in FIGS. 2a and 2b emit lights under the driving of driving signals shown in FIGS. 4a-4e.
Figure 6A:
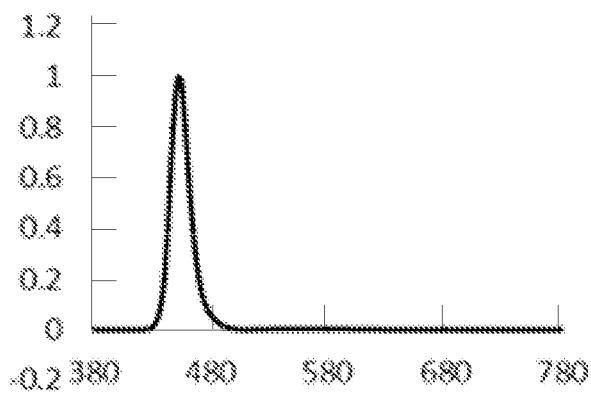
FIGS. 6a-6e show spectrograms when the second sub-pixel in FIGS. 2a and 2b emit lights under the driving of driving signals shown in FIGS. 4a-4e.

In the driving signal shown in FIG. 4a, the amplitude of the positive voltage is 1 and the amplitude of the negative voltage is 0. As shown in FIG. 5a, under the action of the driving signal shown in FIG. 4a, the second light-emitting unit 212 in the first sub-pixel 210 emits light having a wavelength of 400-500 nm, i.e., blue light, and the first light-emitting unit 211 does not emit light under the action of the positive voltage with the amplitude of 1; and the first light-emitting unit 211 and the second light-emitting unit 212 do not emit light under the action of the negative voltage with the amplitude of 0. As shown in FIG. 6a, under the action of the driving signal shown in FIG. 4a, the fourth light-emitting unit 214 in the second sub-pixel 220 also emits light having a wavelength of 400-500 nm, i.e., blue light and the third light-emitting unit 213 does not emit light under the action of the positive voltage with the amplitude of 1; and the third light-emitting unit 213 and the fourth light-emitting unit 214 do not emit light under the action of the negative voltage with the amplitude of 0.

Figure 4B:
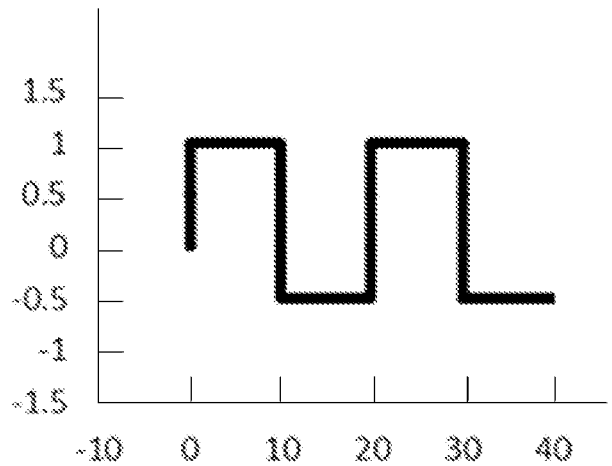
Figure 5B:
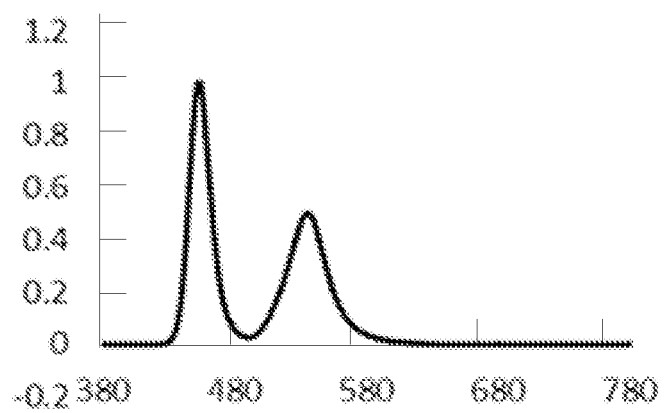
Figure 6B:
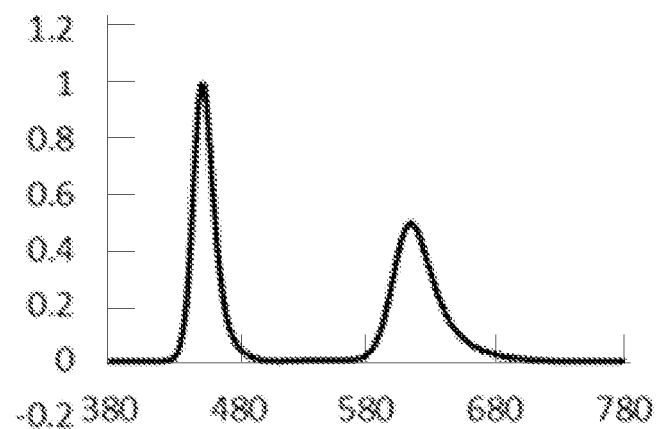

In the driving signal shown in FIG. 4b, the amplitude of the positive voltage is 1 and the amplitude of the negative voltage is 0.5. As shown in FIG. 5b, under the action of the driving signal shown in FIG. 4b, the second light-emitting unit 212 in the first sub-pixel 210 emits light having the wavelength of 400-500 nm, i.e., blue light and the first light-emitting unit 211 does not emit light under the action of the positive voltage with the amplitude of 1; and the first light-emitting unit 211 emits light having a wavelength of 500-580 nm, i.e., green light and the second light-emitting unit 212 does not emit light under the action of the negative voltage with the amplitude of 0.5. Furthermore, since the amplitude of the positive voltage is greater than the amplitude of the negative voltage (that is, the voltage value is high), the brightness of the blue light emitted by the second light-emitting unit 212 is higher than the brightness of the green light emitted by the first light-emitting unit 211. As shown in FIG. 6b, under the action of the driving signal shown in FIG. 4b, the fourth light-emitting unit 214 in the second sub-pixel 220 also emits light having the wavelength of 400-500 nm, i.e., blue light and the third light-emitting unit 213 does not emit under the action of the positive voltage with the amplitude of 1; and the third light-emitting unit 213 emits light having a wavelength of 580-700 nm, i.e., red light and the fourth light-emitting unit 214 does not emit light under the action of the negative voltage with the amplitude of 0.5. Furthermore, since the amplitude of the positive voltage is greater than the amplitude of the negative voltage (that is, the voltage value is high), the brightness of the blue light emitted by the fourth light-emitting unit 214 is higher than the brightness of the red light emitted by the third light-emitting unit 213.

Figure 4C:
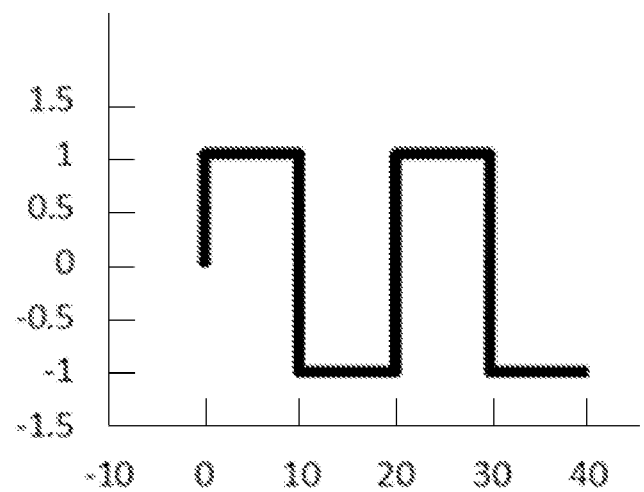
Figure 5C:
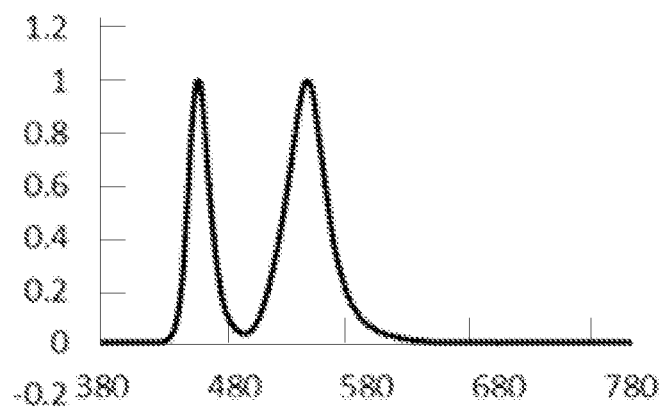
Figure 6C:
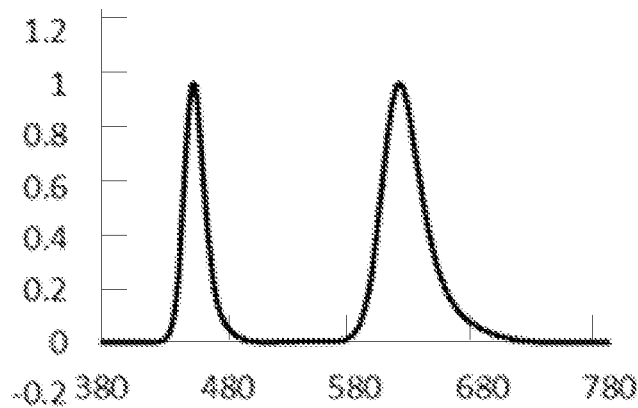

In the driving signal shown in FIG. 4c, the amplitude of the positive voltage is 1 and the amplitude of the negative voltage is 1. As shown in FIG. 5c, under the action of the driving signal shown in FIG. 4c, the second light-emitting unit 212 in the first sub-pixel 210 emits light having the wavelength of 400-500 nm, i.e., blue light and the first light-emitting unit 211 does not emit light under the action of the positive voltage with the amplitude of 1; and the first light-emitting unit 211 emits light having the wavelength of 500-580 nm, i.e., green light and the second light-emitting unit 212 does not emit light under the action of the negative voltage with the amplitude of 1. Furthermore, since the amplitude of the positive voltage is equal to the amplitude of the negative voltage (that is, the voltage values are equal), the brightness of the blue light emitted by the second light-emitting unit 212 is equal to the brightness of the green light emitted by the first light-emitting unit 211. As shown in FIG. 6c, under the action of the driving signal shown in FIG. 4c, the fourth light-emitting unit 214 in the second sub-pixel 220 also emits light having the wavelength of 400-500 nm, i.e., blue light and the third light-emitting unit 213 does not emit light under the action of the positive voltage with the amplitude of 1; and the third light-emitting unit 213 emits light having the wavelength of 580-700 nm, i.e., red light and the fourth light-emitting unit 214 does not emit light under the action of the negative voltage with the amplitude of 1. Furthermore, since the amplitude of the positive voltage is equal to the amplitude of the negative voltage, the brightness of the blue light emitted by the fourth light-emitting unit 214 is equal to the brightness of the red light emitted by the third light-emitting unit 213.

Figure 4D:
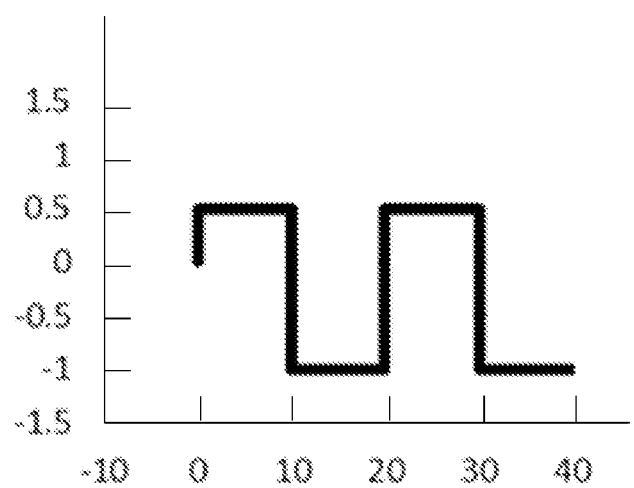
Figure 5D:
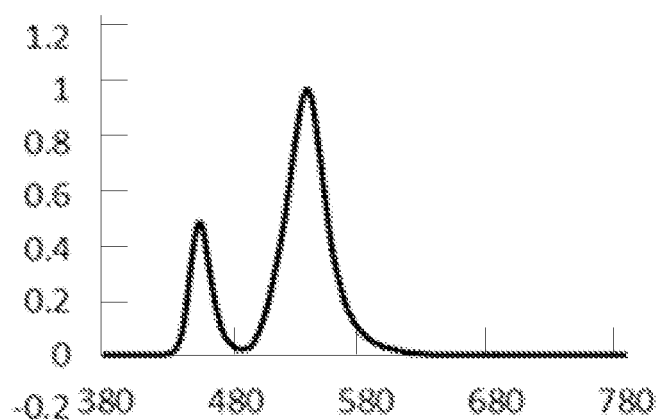
Figure 6D:
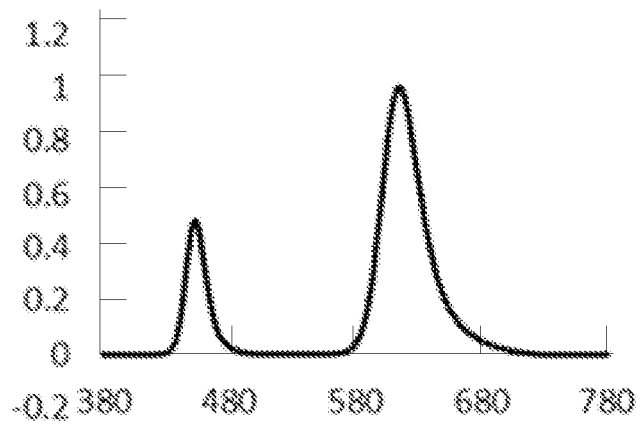

In the driving signals shown in FIG. 4d, the amplitude of the positive voltage is 0.5 and the amplitude of the negative voltage is 1. As shown in FIG. 5d, under the action of the driving signal shown in FIG. 4d, the second light-emitting unit 212 in the first sub-pixel 210 emits light having the wavelength of 400-500 nm, i.e., blue light and the first light-emitting unit 211 does not emit light under the action of the positive voltage with the amplitude of 0.5; and the first light-emitting unit 211 emits light having the wavelength of 500-580 nm, i.e., green light and the second light-emitting unit 212 does not emit light under the action of the negative voltage with the amplitude of 1. Furthermore, since the amplitude of the positive voltage is less than the amplitude of the negative voltage, the brightness of the blue light emitted by the second light-emitting unit 212 is lower than the brightness of the green light emitted by the first light-emitting unit 211. As shown in FIG. 6d, under the action of the driving signal shown in FIG. 4d, the fourth light-emitting unit 214 in the second sub-pixel 220 also emits light having the wavelength of 400-500 nm, i.e., blue light and the third light-emitting unit 213 does not emit light under the action of the positive voltage with the amplitude of 0.5; and the third light-emitting unit 213 emits light having the wavelength of 580-700 nm, i.e., red light and the fourth light-emitting unit 214 does not emit light under the action of the negative voltage with the amplitude of 1. Furthermore, since the amplitude of the positive voltage is less than the amplitude of the negative voltage, the brightness of the blue light emitted by the fourth light-emitting unit 214 is lower than the brightness of the red light emitted by the third light-emitting unit 213.

Figure 4E:
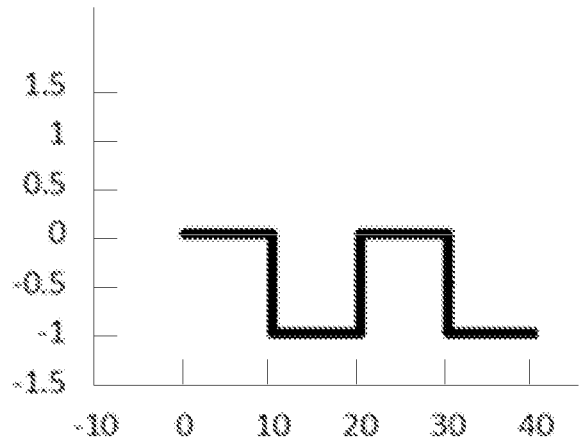
Figure 5E:
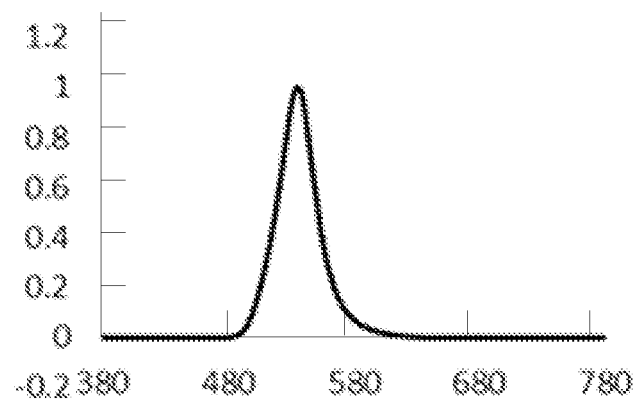
Figure 6E:
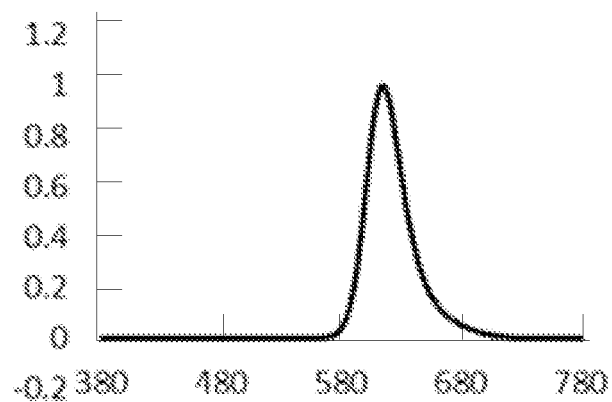

In the driving signal shown in FIG. 4e, the amplitude of the positive voltage is 0 and the amplitude of the negative voltage is 1. As shown in FIG. 5e, under the action of the driving signal shown in FIG. 4e, the first light-emitting unit 211 and the second light-emitting unit 212 in the first sub-pixel 210 do not emit light under the action of the positive voltage with the amplitude of 0; and the first light-emitting unit 211 emits light having the wavelength of 500-580 nm, i.e., green light and the second light-emitting unit 212 does not emit light under the action of the negative voltage with the amplitude of 1. As shown in FIG. 6e, under the action of the driving signal shown in FIG. 4e, the third light-emitting unit 213 and the fourth light-emitting unit 214 in the second sub-pixel 220 do not emit light under the action of the positive voltage with the amplitude of 0; and the third light-emitting unit 213 emits light having the wavelength of 580-700 nm, i.e., red light and the fourth light-emitting unit 214 does not emit light under the action of the negative voltage with the amplitude of 1.

It should be noted that in other embodiments, the first sub-pixel 210 and the second sub-pixel 220 may be arranged as follows: one of the first light-emitting unit 211 and the second light-emitting unit 212 emits red light and the other one emits green light, and both the third light-emitting unlit 213 and the fourth light-emitting unit 214 are configured to emit blue light. Since the light-emitting layers for emitting green light and red light may adopt a phosphorescent organic light-emitting material having higher light emission efficiency while the light-emitting layer for emitting blue light may adopt a fluorescent light-emitting material having lower light emission efficiency, the light-emitting units for emitting the green light and the red light may be arranged in the same sub-pixel while the two light-emitting units for emitting the blue light may be arranged in the same sub-pixel. In addition, the area of the sub-pixel, to which the two light-emitting units for emitting the blue light belong, is set to be relatively large, thereby avoiding the difference in the brightness of the lights emitted by the two sub-pixels being too large, and improving a display effect of a display panel; alternatively, the two light-emitting units for emitting the blue light, which belong to one sub-pixel, are arranged to emit light at the same time under the same driving signal, so that the brightness of the blue light may be increased under the same light-emitting area, thereby improving the display effect of the display panel. Further, when the two light-emitting units are arranged to emit light simultaneously under the same driving signal, a layer structure of the two light-emitting units may include a first anode, a first light-emitting layer, a common cathode, a second light-emitting layer and a second anode that are successively stacked. The first anode and the second anode are connected to an end of a power source, and the common cathode is connected to the other end of the power source.

Figure 7A:
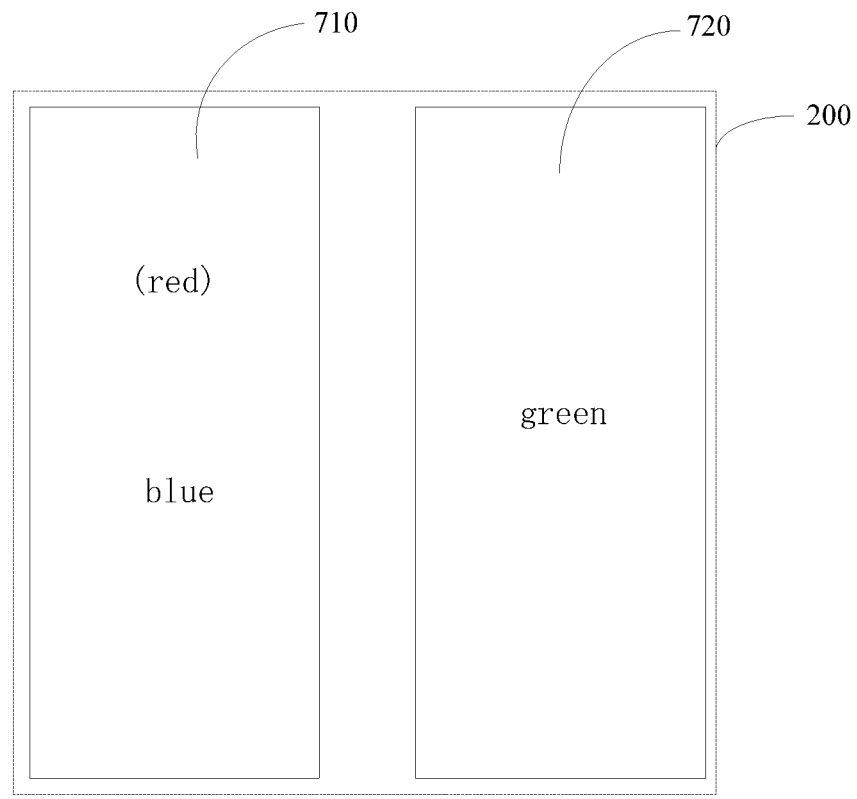
FIG. 7a is a schematic diagram of an enlarged structure of another pixel provided in another embodiment of the present disclosure.
Figure 7B:
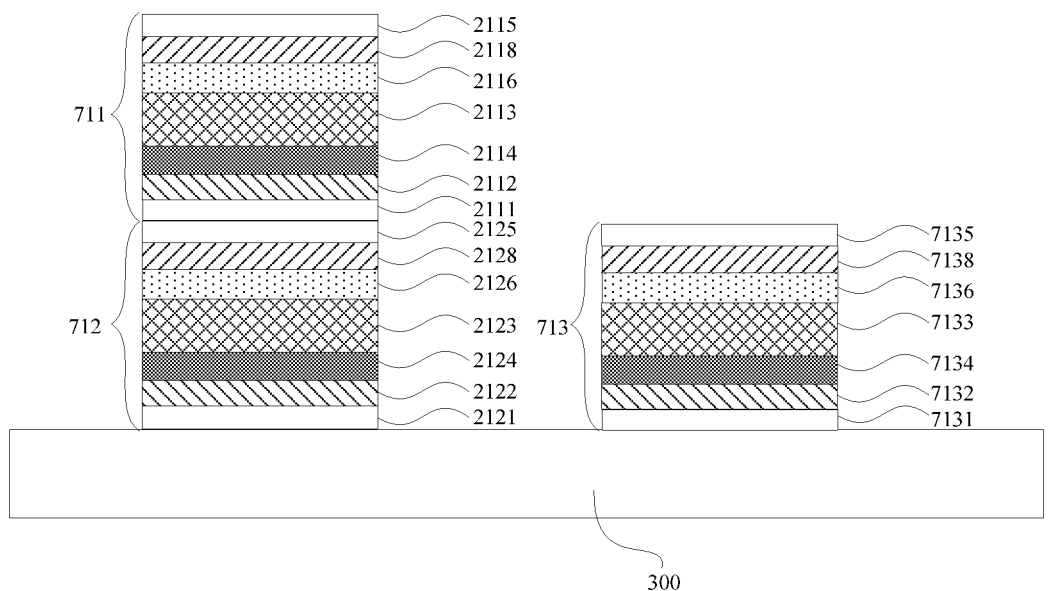

FIG. 7a is a schematic diagram of an enlarged structure of still another embodiment of a pixel of the OLED display substrate in FIG. 1. FIG. 7b is a schematic diagram of a layer structure of the pixel shown in FIG. 7a. As shown in FIGS. 7a and 7b, the pixel 200 includes two sub-pixels, i.e., a first sub-pixel 710 and a second sub-pixel 720. The first sub-pixel 710 includes a first light-emitting unit 711 and a second light-emitting unit 712 that are stacked. The second sub-pixel 720 includes a third light-emitting unit 713. The first light-emitting unit 711 is configured to emit blue light. The second light-emitting unit 712 is configured to emit red light. The third light-emitting unit 713 is configured to emit green light.

In some embodiments, the third light-emitting emitting green light is independently arranged, so that the size of the second sub-pixel, to which the third light-emitting unit belongs, may be set according to actual demands, thereby improving the brightness uniformity of the OLED display panel.

Since the light emission efficiency of the light-emitting unit emitting green light is relatively high at present, under the same light-emitting area, the brightness of the green light is higher than the brightness of the blue light and the red light, the light-emitting area of the second sub-pixel may be set to be greater than the light-emitting area of the first sub-pixel, that is, the light-emitting area of the sub-pixel corresponding to the green light is set to be relatively small and the area of the sub-pixel corresponding to the red light and blue light is set to be relatively large (not shown in the figure). Therefore, the light emission brightness of the first sub-pixel and the light emission brightness of the second sub-pixel are equivalent in unit time, thereby improving the brightness uniformity of the OLED display substrate.

A layer structure of the first light-emitting unit 711 and the second light-emitting unit 712 in FIG. 7b is the same as the layer structure of the first light-emitting unit 211 and the second light-emitting unit 212 in the embodiments shown in FIG. 2b, except that in FIG. 7b a light-emitting layer of each light-emitting unit needs to be made of a material corresponding to the color of emitted light, and the material and thickness of other layers may refer to related descriptions of the first light-emitting unit 211 and the second light-emitting unit 212 and thus are omitted herein.

With reference to FIG. 7b, the third light-emitting unit 713 includes an anode 7131, an HIL 7132, an HTL 7134, a light-emitting layer 7133, an ETL 7136, an EIL 7138 and a cathode 7135 that are successively stacked on the substrate 300. Herein, the anode 7131 may be made of an indium tin oxide (ITO) thin film, an indium zinc oxide (IZO) thin film or other transparent conductive materials such as a conductive material with a work function greater than 4.0 eV, and may be 5-5000 nm in thickness. The light-emitting layer 7133 may be an organic material light-emitting layer or a quantum dot-based light-emitting layer, and may be 5-200 nm in thickness. The cathode 7135 may be made of aluminum or other conductive materials with a work function smaller than 4.0 eV, and may be 100-200 nm in thickness.

The HIL 7132 may be made of organic materials (such as LG-101 and its analogues, and a P-type doped organic hole transporting material) or inorganic materials (such as molybdenum oxide and vanadium oxide). The HTL 7134 may be made of materials such as TPD, CBP, NPD, polyaniline, NPB, and etc. The ETL 7136 may be made of materials such as an organic material, an n-type doped material, inorganic nanoparticles and etc. The EIL 7138 may be made of materials such as lithium fluoride, lithium quinolate and etc.

Optionally, the thickness of the HIL 7112 may be 5-200 nm; the thickness of the HTL 7114 may be 5-200 nm; the thickness of the ETL 7116 may be 5-200 nm; and the thickness of the EIL 7118 may be 0.2-50 nm.

Figure 8:
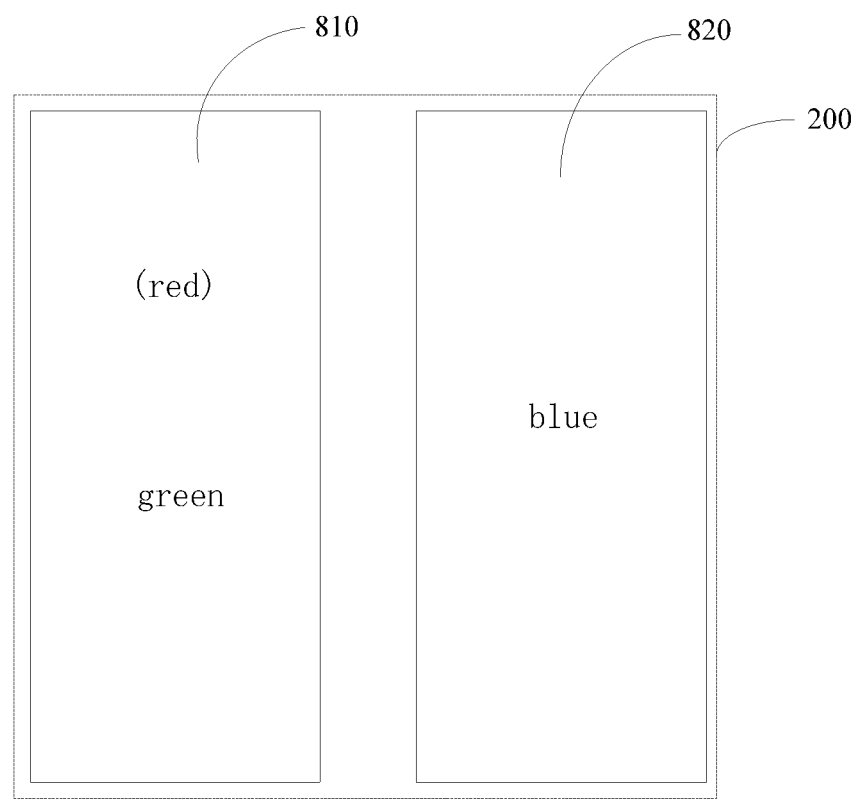
FIG. 8 is a schematic diagram of an enlarged structure of a pixel in another embodiment of the present disclosure.

FIG. 8 is a schematic diagram of an enlarged structure of still other embodiment of a pixel of the OLED display substrate in FIG. 1. In the embodiment shown in FIG. 8, the pixel 200 includes two sub-pixels, i.e., a first sub-pixel 810 and a second sub-pixel 820. The first sub-pixel 810 includes a first light-emitting unit and a second light-emitting unit that are stacked. The second sub-pixel 820 includes a third light-emitting unit. The first light-emitting unit is configured to emit green light. The second light-emitting unit is configured to emit red light. The third light-emitting unit is configured to emit blue light.

In FIG. 8, a layer structure of the first sub-pixel 810 may be the same as the layer structure of the first sub-pixel 710 shown in FIG. 7b, a layer structure of the second sub-pixel 820 may be the same as the layer structure of the second sub-pixel 720 shown in FIG. 7b, except that in FIG. 8 a light-emitting layer of each light-emitting unit needs to be made of a material corresponding to the color of emitted light, and the material and thickness of other layers may refer to related descriptions of the first light-emitting unit 711, the second light-emitting unit 712 and the third light-emitting unit 713 and thus are omitted herein.

Since the light-emitting layers for emitting green light and red light may use a phosphorescent organic light-emitting material having higher light emission efficiency while the light-emitting layer for emitting blue light may use a fluorescent light-emitting material having lower light emission efficiency, the light-emitting units for emitting the green light and the red light may be arranged in the same sub-pixel while the light-emitting unit for emitting blue light may be independently arranged in the other sub-pixel. In addition, the light-emitting area of the sub-pixel provided with the light-emitting unit for emitting blue light is set to be relatively large, thereby avoiding the difference in the brightness of the lights emitted by the two sub-pixels being too large, and improving the display effect of the display panel.

It should be noted that in the embodiments shown in the figure, all the sub-pixels are rectangles. During specific implementation, for different display devices, the sub-pixels of different shapes, such as a regular hexagon and a sector, may be arranged, so as to meet different design requirements.

There is further provided an OLED display device in an embodiment of the present disclosure. The OLED display device includes the OLED display substrate 100 shown in FIG. 1. During specific implementation, the OLED display device provided in the embodiments of the present disclosure may be any product or component having a display function, such as a mobile phone, a tablet computer, a television, a display, a laptop computer, a digital photo frame and a navigator.

On the one hand, under the same resolution, when each of the pixels on the OLED display substrate includes two sub-pixels, if the number of the sub-pixels in each of the pixels is reduced, driving structures corresponding to the sub-pixels can be reduced, an occupied area of the driving structures can also be reduced correspondingly, and thus the light-emitting area of each of the sub-pixels can be increased, thereby increasing the aperture ratio of the pixel of the OLED display substrate. On the other hand, in the case where each of the sub-pixels of the OLED display substrate is the same as the sub-pixel of the existing OLED display substrate in size, each of the pixels on the OLED display substrate is set to include two sub-pixels, so that an area of each pixel is reduced, so that the resolution of the OLED display substrate may be improved.

The foregoing descriptions are merely some exemplary embodiments of the present disclosure, and are not intended to limit the present disclosure. Within the spirit and principles of the present disclosure, any modifications, equivalent substitutions, improvements, etc., are within the protection scope of the present disclosure.

What is claimed is:

1. An OLED display substrate, comprising: a plurality of pixels arranged in an array, wherein each of the pixels comprises two sub-pixels; the two sub-pixels comprise a first sub-pixel and a second sub-pixel;

the first sub-pixel comprises a first light-emitting unit and a second light-emitting unit that are stacked, wherein the first light-emitting unit comprises a first anode and a first cathode, a thickness of the first anode is 2-5 nm, a thickness of the first cathode is 100-200 nm; and the second light-emitting unit comprises a second anode and a second cathode, and a thickness of the second cathode is 5-10 nm;

the second sub-pixel comprises a third light-emitting unit; and the first light-emitting unit, the second fight-emitting unit and the third light-emitting unit are configured to emit lights of different colors, and when one of the first light-emitting unit and the second light-emitting unit is configured to emit red light, the other one of the first light-emitting unit and the second light-emitting unit is configured to emit blue light, and the third light-emitting unit is configured to emit green light, and a light-emitting area of the first sub-pixel is greater than a light-emitting area of the second sub-pixel.

2. The OLED display substrate according to claim 1, wherein the first light-emitting unit is configured to emit red light; the second light-emitting unit and the fourth light-emitting unit are configured to emit blue light; the third light-emitting unit is configured to emit green light; and the second light-emitting unit and the fourth light-emitting unit are located at a same side of the first light-emitting unit and the third light-emitting unit.

3. The OLED display substrate according to claim 1, wherein the second sub-pixel further comprises a fourth light-emitting unit; the fourth light-emitting unit and the third light-emitting unit are stacked; a color of light emitted by the fourth light-emitting unit is different from colors of lights emitted by the first light-emitting unit, the second light-emitting unit and the third light-emitting unit.

4. The OLED display substrate according to claim 1, wherein one of the first light-emitting unit and the second light-emitting unit is configured to emit red light; the other one of the first light-emitting unit and the second light-emitting unit is configured to emit green light; and the third light-emitting unit is configured to emit blue light.

5. The OLEO display substrate according to claim 1, wherein the second sub-pixel further comprises a fourth light-emitting unit; the fourth light-emitting unit and the third light-emitting unit are stacked; a color of light emitted by the fourth light-emitting unit is the same as a color of light emitted by any one of the first light-emitting units, the second light-emitting unit and the third light-emitting unit.

6. The OLED display substrate according to claim 5, wherein one of the first light-emitting unit and the second light-emitting unit is configured to emit red light; the other one of the first light-emitting unit and the second light-emitting unit is configured to emit green light; and both the third light-emitting unit and the fourth light-emitting unit are configured to emit blue light.

7. The OLED display substrate according to claim 1, wherein the first light-emitting unit comprises a first light-emitting layer, the first anode, the first light-emitting layer and the first cathode are successively stacked on the second light-emitting unit; and the second light-emitting unit comprises a second light-emitting layer, the second anode, the second light-emitting layer and the second cathode are successively stacked.

8. The OLED display substrate according to claim 7, wherein the light-emitting layer for emitting green light and the light-emitting layer for emitting red light adopt phosphorescent organic light-emitting material, and the light-emitting layer for emitting blue light adopts a fluorescent light-emitting material.

9. The OLED display substrate according to claim 7, wherein the second anode is made of a transparent conductive material; and the first cathode is made of metal.

10. The OLED display substrate according to claim 7, wherein thicknesses of the first light-emitting layer and the second light-emitting layer are 5-200 nm.

11. The OLED display substrate according to claim 7, wherein the first light-emitting unit and the second light-emitting unit each further comprises a hole injection layer, a hole transporting layer, an electron transporting layer and an electron injection layer; and the second anode, the hole injection layer of the second light-emitting unit, the hole transporting layer of the second light-emitting unit, the second light-emitting layer, the electron transporting layer of the second light-emitting unit, the electron injection layer of the second light-emitting unit, the second cathode, the first anode, the hole injection layer of the first light-emitting unit, the hole transporting layer of the first light-emitting unit, the first light-emitting layer, the electron transporting layer of the first light-emitting unit, the electron injection layer of the first light-emitting unit, and the first cathode are successively stacked.

12. The OLED display substrate according to claim 11, wherein thicknesses of the hole injection layer, the hole transporting layer and the electron transporting layer are 5-200 nm, and a thickness of the electron injection layer is 0.2-50 nm.

13. The OLED display substrate according to claim 7, wherein in the first sub-pixel, the first anode and the second cathode are stacked and connected with a same thin film transistor; and the second anode and the first cathode are connected with a same signal line.

14. The OLED display substrate according to claim 13, further comprising a plurality of thin film transistors, wherein each of the sub-pixels is correspondingly connected to one of the thin film transistors, each of the TFTs comprises a buffer layer arranged on a base substrate, an active layer arranged on the buffer layer, a gate insulating layer arranged on the active layer, a gate electrode arranged on a predetermined region of the gate insulating layer, an intermediate insulating layer arranged on the gate electrode, and a source electrode and a drain electrode that are arranged on the intermediate insulating layer; the source electrode and the drain electrode are respectively connected with a source electrode region and a drain electrode region of the active layer through a via; an intermediate electrode of the first sub-pixel is connected with the source electrode of the thin film transistor corresponding to the first sub-pixel through a via; and the intermediate electrode is formed by stacking the first anode and the second cathode.

15. The OLED display substrate according to claim 13, wherein the first anode is made of Ag; and the second cathode is made of Au.

16. The OLED display substrate according to claim 13, wherein the signal line is configured to input an alternating current signal; and the frequency of the alternating current signal is not less than 30 Hz.

17. The OLED display substrate according to claim 16, wherein the frequency of the alternating current signal is 100-120 Hz.

18. An OLED display device, comprising: an OLED display substrate comprising: a plurality of pixels arranged in an array, wherein each of the pixels comprises two sub-pixels; the two sub-pixels comprise a first sub-pixel and a second sub-pixel;
the first sub-pixel comprises a first light-emitting unit and a second light-emitting unit that are stacked, wherein the first light-emitting unit comprises a first anode and a first cathode, a thickness of the first anode is 2-5 nm, a thickness of the first cathode is 100-200 nm; and the second light-emitting unit comprises a second anode and a second cathode, and a thickness of the second cathode is 5-10 nm;
the second sub-pixel comprises a third light-emitting unit; and the first light-emitting unit, the second light-emitting unit and the third light-emitting unit are configured to emit lights of different colors, and when one of the first light-emitting unit and the second light-emitting unit is configured to emit red light, the other one of the first light-emitting unit and the second light-emitting unit is configured to emit blue light, and the third light-emitting unit is configured to emit green light, and a light-emitting area of the first sub-pixel is greater than a light-emitting area of the second sub-pixel.

19. An OLED display substrate, comprising: a plurality of pixels arranged in an array, wherein each of the pixels comprises two sub-pixels, the two sub-pixels comprise a first sub-pixel and a second sub-pixel;
the first sub-pixel comprises a first light-emitting unit and a second light-emitting unit that are stacked and have a same area; the first light-emitting unit comprises a first anode, a hole injection layer of the first light-emitting unit, a hole transporting layer of the first light-emitting unit, a first light-emitting layer, an electron transporting layer of the first light-emitting unit, an electron injection layer of the first light-emitting unit, and the first cathode that are successively stacked on the second light-emitting unit, wherein the first anode is made of Ag, a thickness of the first anode is 2-5 nm, a thickness of the first cathode is 100-200 nm; and the second light-emitting unit comprises a second anode, a hole injection layer of the second light-emitting unit, a hole transporting layer of the second light-emitting unit, a second light-emitting layer, an electron transporting layer of the second light-emitting unit, an electron injection layer of the second light-emitting unit, and a second cathode that are successively stacked, wherein the second cathode is made of Au, a thickness of the second cathode is 5-10 nm; in any one of the first sub-pixel, the first anode and the second cathode are stacked and connected with a same thin film transistor; and the second anode and the first cathode are connected with a same signal line, the signal line is configured to input an alternating current signal; and the frequency of the alternating current signal is 100-120 Hz; thicknesses of the hole injection layer, the hole transporting layer, the first light-emitting layer, the second light-emitting layer and the electron transporting layer are 5-200 nm, and a thickness of the electron injection layer is 0.2-50 nm;
the second sub-pixel comprises a third light-emitting unit and a fourth light-emitting unit that are stacked and have the same area, and a layer structure of the third light-emitting unit and the fourth light-emitting unit that are stacked, which is the same as a layer structure of the first light-emitting unit and the second light-emitting unit;
the first light-emitting unit, the second light-emitting unit, and the third light-emitting unit are configured to emit lights of different colors, and when one of the first light-emitting unit and the second light-emitting unit is configured to emit red light, the other one of the first light-emitting unit and the second light-emitting unit is configured to emit blue light, and the third light-emitting unit is configured to emit green light, and a light-emitting area of the first sub-pixel is greater than a light-emitting area of the second sub-pixel.

* * * * *